United States Patent
Kamo et al.

(10) Patent No.: US 7,304,329 B2
(45) Date of Patent: Dec. 4, 2007

(54) FIELD EFFECT TRANSISTOR

(75) Inventors: Yoshitaka Kamo, Tokyo (JP); Tetsuo Kunii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 341 days.

(21) Appl. No.: 10/985,057

(22) Filed: Nov. 10, 2004

(65) Prior Publication Data

US 2005/0116302 A1 Jun. 2, 2005

(30) Foreign Application Priority Data

Nov. 12, 2003 (JP) ............... 2003-382126

(51) Int. Cl.
- *H01L 31/072* (2006.01)
- *H01L 31/109* (2006.01)
- *H01L 31/0328* (2006.01)
- *H01L 31/0336* (2006.01)

(52) U.S. Cl. .......... 257/192; 257/E29.32; 257/E29.148

(58) Field of Classification Search ........ 257/192–194, 257/E29.32, E29.148

See application file for complete search history.

(56) References Cited

U.S. PATENT DOCUMENTS 4,486,766 A * 12/1984 Shannon ..................... 257/269

5,023,676 A * 6/1991 Tatsuta ........................ 257/280

FOREIGN PATENT DOCUMENTS

| GB | 2103013 A | * | 7/1982 |
| JP | 6-338610 | | 12/2004 |

* cited by examiner

*Primary Examiner*—Monica Lewis
(74) *Attorney, Agent, or Firm*—Leydig, Voit & Mayer, Ltd.

(57) ABSTRACT

A field effect transistor includes a semiconductor substrate having an active region, a source region, and a drain region at an upper portion of the substrate. The active region is located between the source and drain regions. A gate electrode is located on the active region. A source electrode is located on the source region and forms an ohmic contact with the source region. A drain electrode has a base part on and in ohmic contact with the drain region and an extended part having edge close to the gate electrode and over a boundary between the active region and the drain region. An insulating film is located between the boundary and the extended part and has a thickness that increases along a direction from the drain electrode toward the gate electrode in a step-by-step or continuous manner.

4 Claims, 8 Drawing Sheets

FIELD EFFECT TRANSISTOR

RELATED APPLICATION

This application is based on Japanese Patent Application No. 2003-382126, the content of which is incorporated herein by reference.

BACKGROUND OF THE INVENTION

1. Field of the Invention

The present invention relates to a field effect transistor.

2. Description of the Related Art

Conventionally, there has been known a field effect transistor (FET) in which a semiconductor substrate has an active layer, a source region and a drain region at an upper portion thereof. The active layer is located between the source and the drain regions. A gate electrode is provided on the active layer. A source electrode is in ohmic contact with the source region. A drain electrode is in ohmic contact with the drain region.

When the FET is in operation, an electric field is concentrated at an edge of the drain region opposed to the gate electrode (i.e. a boundary portion between the drain region and the active layer), causing a high voltage to be applied to the boundary portion. This may result in a leakage of an electric current at the boundary portion and/or a dielectric breakdown. Therefore, the transistor is difficult to be used in high voltage.

Another type of FET is known in which the active layer has a recess on which the gate electrode is provided. When the transistor is in operation, an electric field is concentrated at a corner of the recess. As a result, the transistor is difficult to be used in high voltage.

As related art, Japanese Patent Publication No. 6-338610 discloses a MOS type field effect transistor in which a gate oxide film is provided between the gate electrode and the semiconductor substrate and is extended to a region between the drain electrode and a boundary between the drain region and the drift region.

SUMMARY OF THE INVENTION

An object of the present invention is to provide a field effect transistor in which electric field concentration at a boundary between the active region and the drain region or at a corner of a recess is reduced in order to allow a high operation voltage.

To achieve the above object, in a first aspect of the present invention, a field effect transistor includes a semiconductor substrate having an active region, a source region, and a drain region at an upper portion of the substantive. The active region is located between the source and drain regions. A gate electrode is located on the active region. A source electrode forms an ohmic contact with the source region. A drain electrode has a base part in ohmic contact with the drain region and an extended part with an edge closer to the gate electrode than to a boundary between the active region and the drain region. An insulating film is located between the boundary and the extended part and has a thickness that increases along a direction from the drain electrode toward the gate electrode in a step-by-step or continuous manner.

In accordance with the first aspect of the present invention, since the insulating film is interposed between the boundary and the extended part of the drain electrode, the electric field concentrated at the boundary interferes with an electric field generated in a MIS (Metal Insulator Semiconductor) structure consisting of the extended part of the drain electrode, the insulating film, and the active region, thereby reducing the electric field concentration. Further, since the insulating film has a thickness that increases along a direction from the drain electrode toward the gate electrode in a step-by-step or continuous manner, electric field concentration at a portion of the active region located at or proximate a point directly below the edge of the extended part is reduced. This allows a high operation voltage of the transistor.

In a second aspect of the present invention, a field effect transistor includes a semiconductor substrate having an active region, a source region, and a drain region at an upper portion of the substrate. The active region has a recess located between the source and drain regions. A gate electrode is located in the recess. A source electrode forms an ohmic contact with the source region. A drain electrode has a base part in ohmic contact with the drain region and an extended part with an edge closer to the gate electrode than to a corner of the recess. An insulating film is located between the corner of the recess and the extended part of the drain electrode.

In accordance with the second aspect of the present invention, since the insulating film is interposed between the recess corner and the extended part of the drain electrode, the electric field concentrated at the recess corner interferes with an electric field generated in a MIS structure consisting of the extended part of the drain electrode, the insulating film, and the active region, thereby reducing the electric field concentration. This allows a high operation voltage of the transistor.

BRIEF DESCRIPTION OF THE DRAWINGS

The above-mentioned and other objects, advantages and features of the invention will become apparent from the following description thereof taken in conjunction with the accompanying drawings in which.

DETAILED DESCRIPTION OF THE PREFERRED EMBODIMENTS

With reference to the drawings, preferred embodiments of the present invention will be described hereinafter. Although a description is provided for a Schottky gate field effect transistor (MESFET) in the following, the present invention can be applied to another type of FET such as pn junction FET or MIS (Metal Insulator Semiconductor) FET.

First Embodiment

Figure 1:
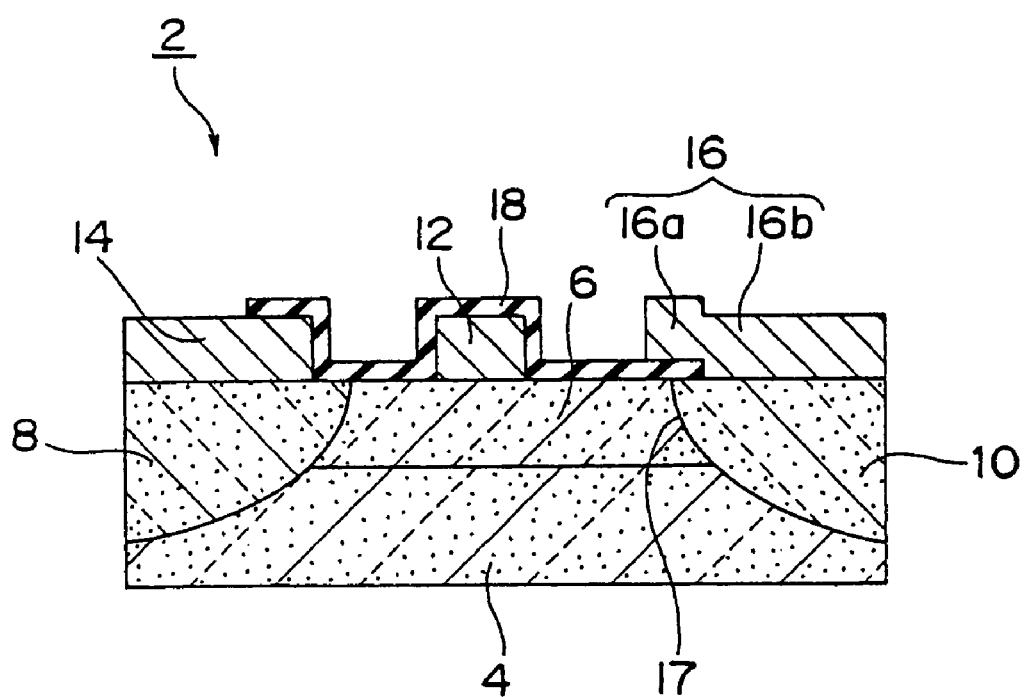
FIG. 1 is a sectional view of a first embodiment of the FET according to the present invention.

Referring to FIG. 1, there is shown a MESFET, which is a first embodiment of the FET according to the present invention. The MESFET, indicated generally at reference number 2, includes a GaAs semi-insulating semiconductor substrate 4 having an n active layer 6 and $n^+$ active layers, which are source and drain regions 8 and 10, at an upper portion of the substrate. The active layer 6 is located between the source region 8 and the drain region 10. A gate electrode 12 is provided on the active layer 6 so that a Schottky junction is formed therebetween. A source electrode 14 is provided on the source region 8 so that an ohmic contact is formed therebetween. A drain electrode 16 is provided on the drain region 10 so that an ohmic contact is formed therebetween. The drain electrode 16 has an extended part 16a with its one edge closer to the gate electrode 12 than an edge of the drain region 10 (i.e. a boundary portion 17 between the drain region and the active layer 6). An insulation film 18 is formed between the boundary portion 17 and the extended part 16a. As shown, the insulation film 18 is designed to function as passivation film to cover the MESFET 2. Although not illustrated, wiring metal layers are formed on the source electrode 14 and the drain electrode 16, respectively.

Referring now to FIGS. 2A-2H, an exemplary method for manufacturing the MESFET 2 according to the embodiment will be described.

Figure 2A:
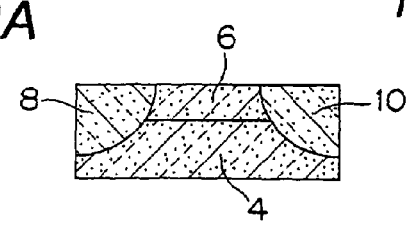
FIGS. 2A-2H illustrate an exemplary method for manufacturing the FET in FIG. 1.

First, the n active layer 6 is formed at an upper portion of the GaAs semi-insulating substrate 4 using, for example, an epitaxial growth technique. Next, ions are injected into predetermined regions at the upper portion of the substrate 4 to form the $n^+$ active layers (the source and the drain regions 8, 10) (FIG. 2A).

Figure 2B:
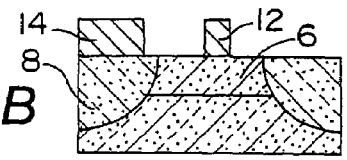

Then, the gate and the source electrodes 12, 14 are formed using an evaporation liftoff technique. Specifically, a photoresist having apertures corresponding to the gate and the source electrodes 12, 14 is formed on the surface. A layer of a material such as aluminum for the electrodes is then formed by evaporation. The photoresist is then lifted off to leave the electrode material layers on the active layer 6 and the source region 8, thereby forming the gate electrode 12 and the source electrode 14, respectively (FIG. 2B).

Figure 2C:
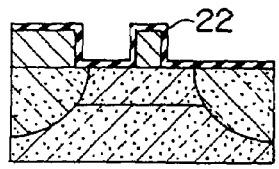
Figure 2D:
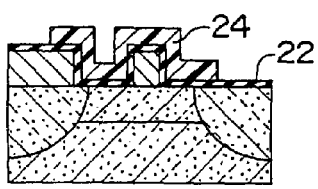
Figure 2E:
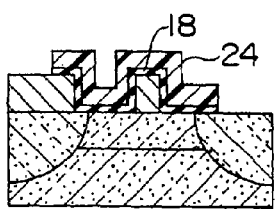

Thereafter, an insulation layer 22 made of SiN or SiO, for example, is formed to cover the surface (FIG. 2C). Next, a photoresist 24 having an aperture corresponding to a part 16b (FIG. 1) that is a base part in ohmic contact with the drain region 10 other than the extended part 16a of the drain electrode 16 and an aperture corresponding to a wiring metal layer to be formed on the source electrode 14 (FIG. 2D). The insulation layer 22 is then processed using, for example, an ECR (electronic cyclotron resonance) plasma etching technique to form the insulation film 18 (FIG. 2E). Thereafter, the photoresist 24 is removed.

Figure 2F:
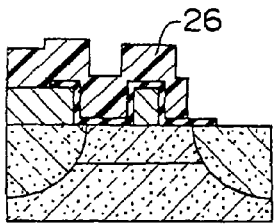
Figure 2G:
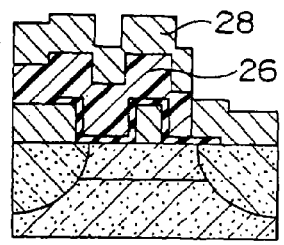
Figure 2H:
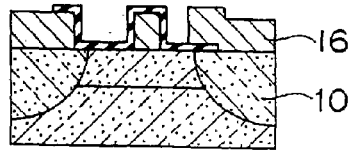

Next, a photoresist 26 having apertures corresponding to the extended and base parts 16a, 16b (FIG. 1) of the drain electrode 16 is formed (FIG. 2F). An electrode material layer 28 made of aluminum, for example, is then formed by evaporation (FIG. 2G). Thereafter, the photoresist 26 is lifted off to leave an electrode material layer on the drain region 10 and on the insulation film 18, thereby forming the drain electrode 16 (FIG. 2H). Although not illustrated, wiring metal layers are then formed on the source and the drain electrodes 14, 16.

According to the embodiment, the insulation film 18 is interposed between the boundary portion 17 (between the active layer 6 and the drain region 10) and the extended part 16a of the drain electrode 16. Accordingly, in operation of the MESFET 2, an electric field concentrated at the boundary portion 17 interferes with an electric field generated in a MIS structure consisting of the extended part 16a of the drain electrode 16, the insulation film 18 and the active layer 6, thereby reducing the electric field concentration. Thus, MESFET 2 can be operated in high voltage. Such effect is achieved by providing an insulation film between the extended part 16a and the boundary portion 17 to prevent the extended part and the active layer 6 from being in contact with each other. Therefore, a construction in which an insulation film, which is an element of the MIS structure, does not function as passivation film of the MESFET 2 falls within the scope of the present invention.

Second Embodiment

Figure 3:
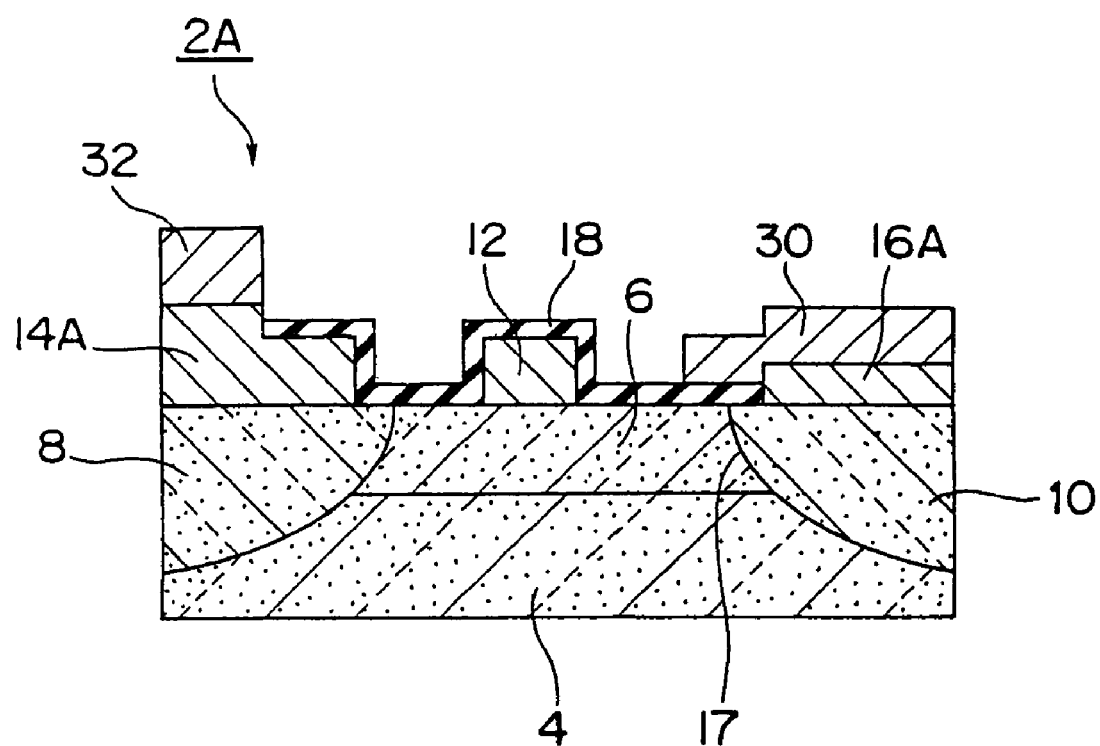
FIG. 3 is a sectional view of a second embodiment of the FET according to the present invention.

With reference to FIG. 3, a second embodiment of the FET according to the present invention will now be described. In a description below, components identical or similar to those in the first embodiment are indicated by identical reference numbers or those with suffixes. In the MESFET 2A of the embodiment, a MIS structure is formed using a wiring metal layer connected with the drain electrode in order to reduce the electric field concentration at an edge of the drain region.

More specifically, unlike in the first embodiment, the drain electrode 16A of the MESFET 2A is provided with no extended part on the insulation film. Instead, a wiring metal layer 30 is formed on the drain electrode 16A to form a base part and is extended to form an extended part so that the insulation film 18 is interposed between the extended part and the boundary portion 17. Accordingly, in operation of the MESFET 2A, an electric field concentrated at the boundary portion 17 interferes with an electric field generated in a MIS structure consisting of the extended part of the wiring metal layer 30, the insulation film 18 and the active layer 6, thereby reducing the electric field concentration.

Referring now to FIGS. 4A-4H, an exemplary method for manufacturing the MESFET 2A according to the embodiment will be described.

Figure 4A:
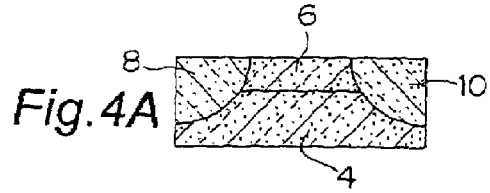
FIGS. 4A-4H illustrate an exemplary method for manufacturing the FET in FIG. 3.
Figure 4B:
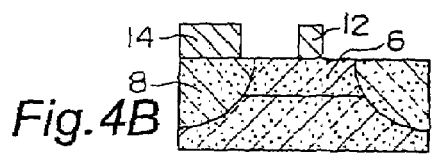

Like the MESFET 2 in the first embodiment, the n active layer 6, the source region 8 and the drain region 10 are initially formed at an upper portion of the GaAs semi-insulating substrate 4 (FIG. 4A) and the gate and the source electrodes 12, 14 are then formed on the active layer and the source region, respectively (FIG. 4B).

Figure 4G:
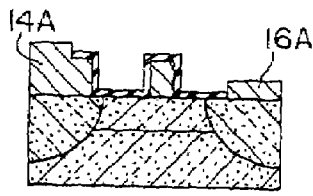
Figure 4H:
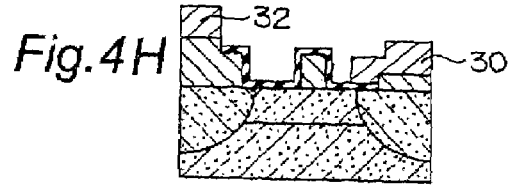
Figure 4C:
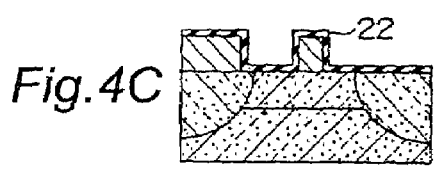
Figure 4D:
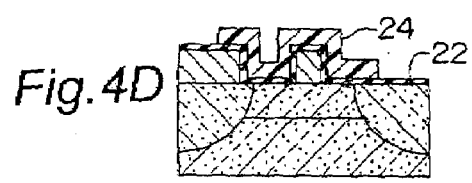
Figure 4E:
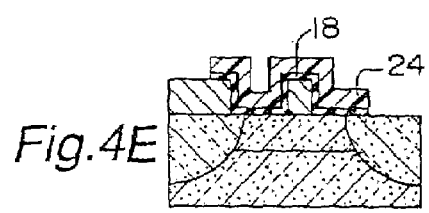
Figure 4F:
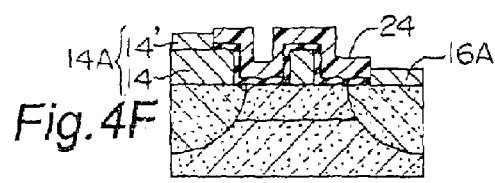

Thereafter, the insulation layer 22 is formed to cover the surface (FIG. 4C). Next, a photoresist 24 having an aperture corresponding to the drain electrode 16A and an aperture corresponding to a wiring metal layer for the source electrode 14 is formed (FIG. 4D). The insulation layer 22 is then processed using, for example, an ECR plasma etching technique to form the insulation film 18 (FIG. 4E). Thereafter, electrode material layers are formed by evaporation while the photoresist 24 is left on the surface. The photoresist 24 is then lifted off to leave an electrode material layer part on the drain region 10, thereby forming the drain electrode 16A (FIG. 4F). At this stage, an electrode material layer part 14' is also left on the source electrode 14 so that the layer part 14' and the electrode 14 form the source electrode 14A of the MESFET 2A. Thereafter, the photoresist 24 is removed (FIG. 4G).

Next, a photoresist (not shown) having an aperture corresponding to the wiring metal layer 30 for the drain electrode 16A and an aperture corresponding to a wiring metal layer 32 for the source electrode 14A is formed. A metal layer made of aluminum, for example, is then formed by evaporation. The photoresist is then lifted off to leave part of the metal layer to form the wiring metal layers 30 and 32 (FIG. 4H).

According to the method, since the MIS structure is formed at the step of forming the wiring metal layer 30, the number of steps including a wiring-forming step can be reduced compared to the method described in the first embodiment in which the extended and the base parts of the drain electrode are separately formed.

Third Embodiment

In the first embodiment, the drain electrode 16 is provided with the extended part 16a so that the insulation layer 18 is interposed between the boundary portion 17 (between the active layer 6 and the drain region 10) and the extended part in order to reduce electric field concentration at the boundary portion. As a result, an electric field may be concentrated at a portion of the active layer 6 located at or proximate a point directly below the edge of the extended part 16a. Although such electric field concentration at the active layer portion is smaller than the concentration at the boundary portion 17, the MESFET of the embodiment enables the electric field concentration at the active layer portion to be reduced so that the MESFET can be operated in higher voltage.

Figure 5:
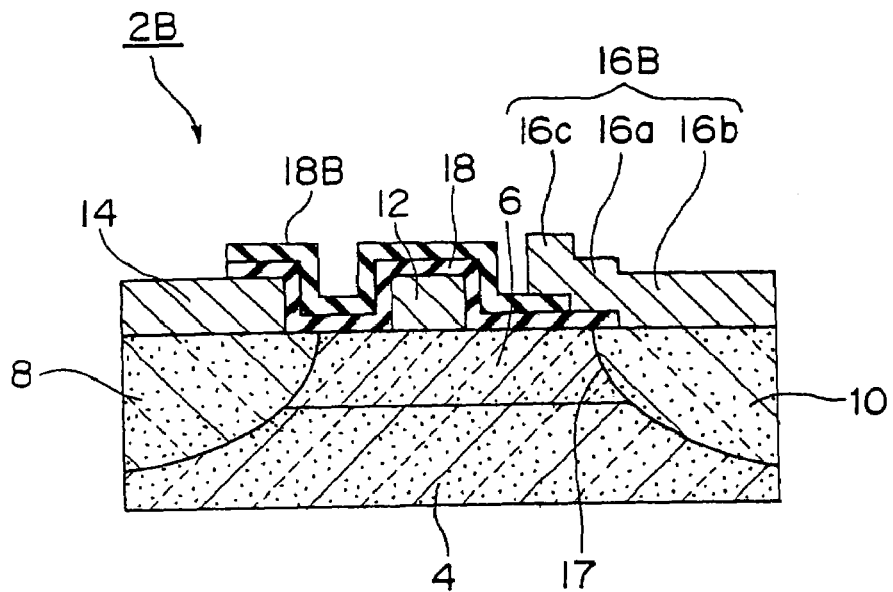
FIG. 5 is a sectional view of a third embodiment of the FET according to the present invention.

Specifically, referring to FIG. 5, the MESFET 2B, which is a FET of the present embodiment, includes an insulation film 18B on the insulation film 18. The insulation film 18B is extended to an edge opposed to the gate electrode 12 of the extended part 16a of the drain electrode 16B (i.e., an edge of the insulation film 18B is located closer to the gate electrode 12 than that of the insulation film 18). A part 16c is extended on the insulation film 18B from the extended part 16a toward the gate electrode 12. The second extended part 16c and the insulation film 18B may be formed in a manner identical to the method for forming the extended part 16a and the insulation film 18.

According to the embodiment, the electric field concentrated at the active layer portion located at or proximate a point directly below the edge opposed to the gate electrode of the extended part 16a interferes with an electric field generated in a MIS structure consisting of the extended part 16c, the insulation films 18, 18B and the active layer 6, thereby reducing the electric field concentration. Accordingly, the MESFET can be operated in higher voltage than the first embodiment.

Also, an insulation layer part between the second extended part 16c and the active layer 6 has a thickness larger than that of an insulation layer part between the extended part 16a and the active layer. Accordingly, the electric field concentration generated at an active layer portion located at or proximate a point directly below the edge opposed to the gate electrode 12 of the second extended part 16c is smaller than that generated at an active layer portion located at or proximate a point directly below the edge opposed to the gate electrode of the extended part 16a. As such, an insulation film is formed to have a thickness increased in a step-by-step manner along a direction from the drain electrode 16B toward the gate electrode 12, thereby reducing a risk of dielectric breakdown at the active layer portion located at or proximate a point directly below the edge opposed to the gate electrode of the drain electrode 16B (i.e. the edge of the second extended part 16c).

Figure 6:
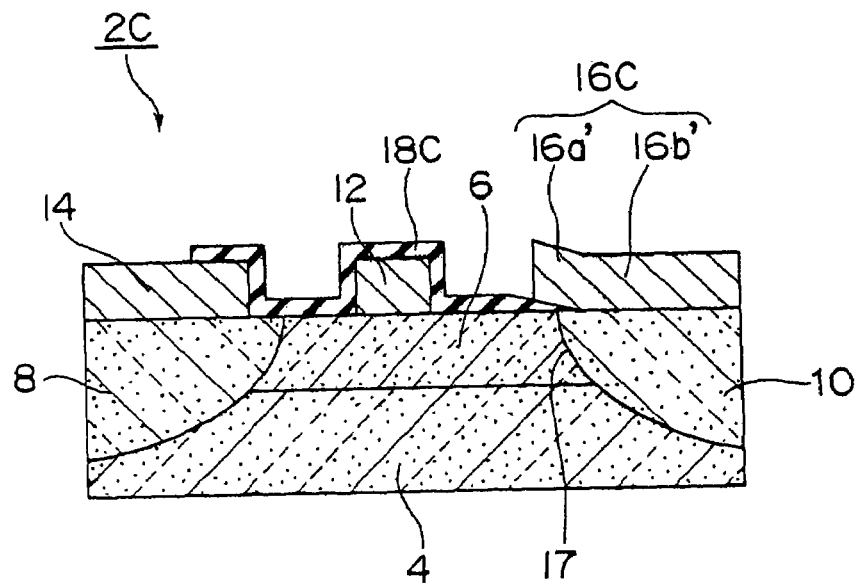
FIG. 6 is a sectional view of a variant of the third embodiment of the FET according to the present invention.

Referring to FIG. 6, such effect can be achieved by forming an insulation film 18C so that the thickness thereof is increased in a continuous manner along a direction from a drain electrode 16C toward the gate electrode 12.

Figure 7A:
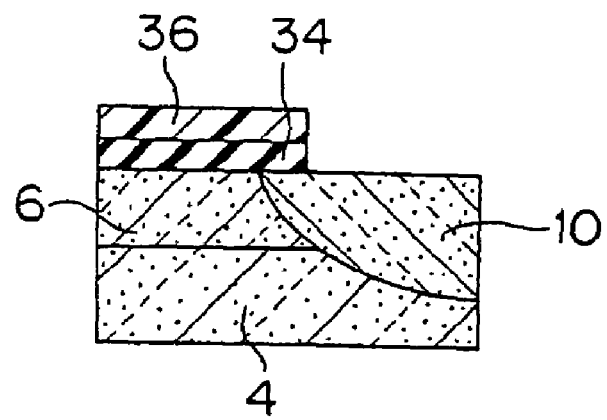
FIGS. 7A-7D illustrate some of the steps for manufacturing the FET in FIG. 6.
Figure 7B:
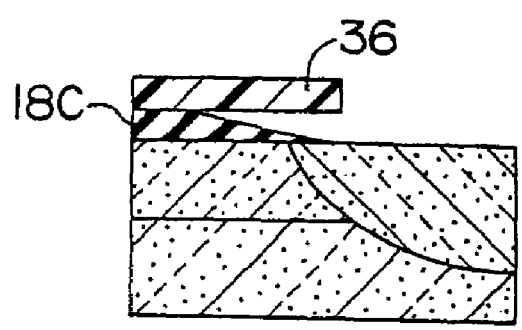
Figure 7C:
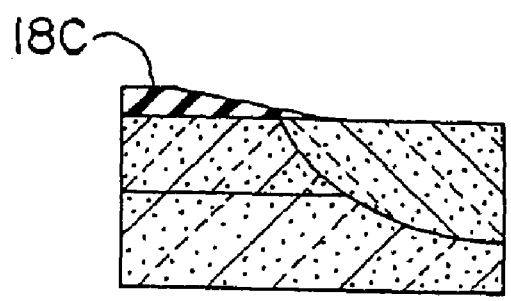
Figure 7D:
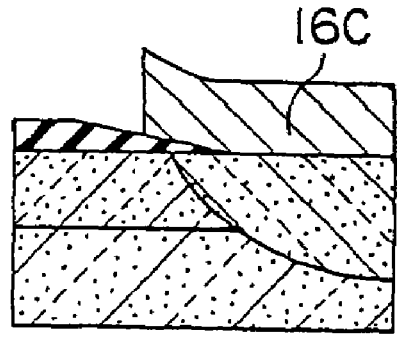

Referring to FIGS. 7A-7D showing some of the steps for manufacturing the MESFET 2C, an insulation layer 34 is formed on the surface like in the previous embodiments other than a region corresponding to the base part 16b' of the drain electrode 16C (FIG. 7A). Next, a wet etching using, for example, hydrofluoric acid is performed while a photoresist 36 which has been used to form the insulation layer 34 is left. As a result, a side of the insulation layer 34 is etched to form a tapered insulation film, which is the insulation film 18C, as shown in FIG. 7B. Thereafter, the photoresist 36 is removed (FIG. 7C). Next, a photoresist (not shown) having an aperture corresponding to the base and extended parts 16b', 16a' of the drain electrode 16C is formed. Thereafter, an electrode material layer corresponding to the drain electrode 16C is formed and the photoresist is then removed to complete the MESFET 2C.

Fourth Embodiment

Figure 8:
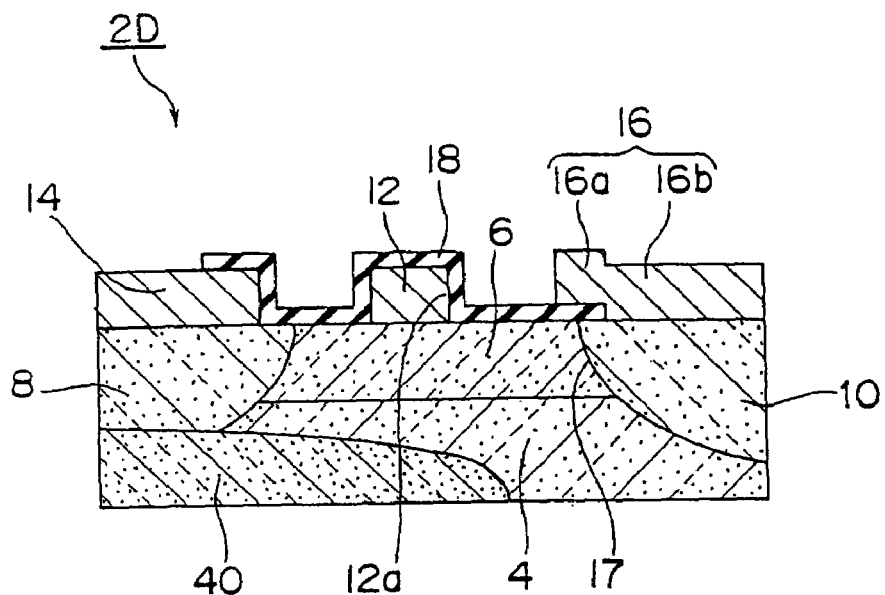
FIG. 8 is a sectional view of a fourth embodiment of the FET according to the present invention.

In the first embodiment, the drain electrode 16 is extended toward the gate electrode 12 to reduce the electric field concentration at the boundary portion 17 between the active layer 6 and the drain region 10. However, such construction causes an electric field to be concentrated at an edge opposed to the drain electrode 16 of the gate electrode 12. The MESFET 2D shown in FIG. 8, which is a FET of the present embodiment, includes a construction to reduce such electric field concentration.

Specifically, the MESFET 2D has a conductive layer 40 at a lower (bottom) portion of the semiconductor substrate 4. The conductive layer 40 is formed from below the source region 8 to a region located at or proximate a point directly below the edge 12a opposed to the drain electrode 16 of the gate electrode 12. The conductive layer 40 is an $n^+$ active layer formed by, for example, an ion injection technique so that it is in contact with the source region 8. Therefore, in operation of the MESFET 2D, the conductive layer 40 has an electric potential identical to that of the source electrode 14. Note that the source electrode 14 is grounded in operation.

In operation, since voltages of opposite polarity are applied to the gate and the drain electrodes 12, 16, there is a region with an electric potential of 0V in the active layer 6 between the gate and the drain electrodes. Accordingly, by providing a region having an electric potential of 0V located at or proximate a point directly below the edge 12a of the gate electrode 12, the electric field concentration generated at the edge 12a in operation can be reduced.

The conductive layer 40 may be formed using a technique other than ion injection. For example, a lower portion of the semiconductor substrate 4 may be removed from below the source region 8 to a region located at or proximate a point directly below the edge 12a of the gate electrode 12 using, for example, a wet etching technique and metal (e.g. gold) may be then embedded into the substrate or plated on an exposed surface of the substrate to form the conductive layer 40.

Figure 9:
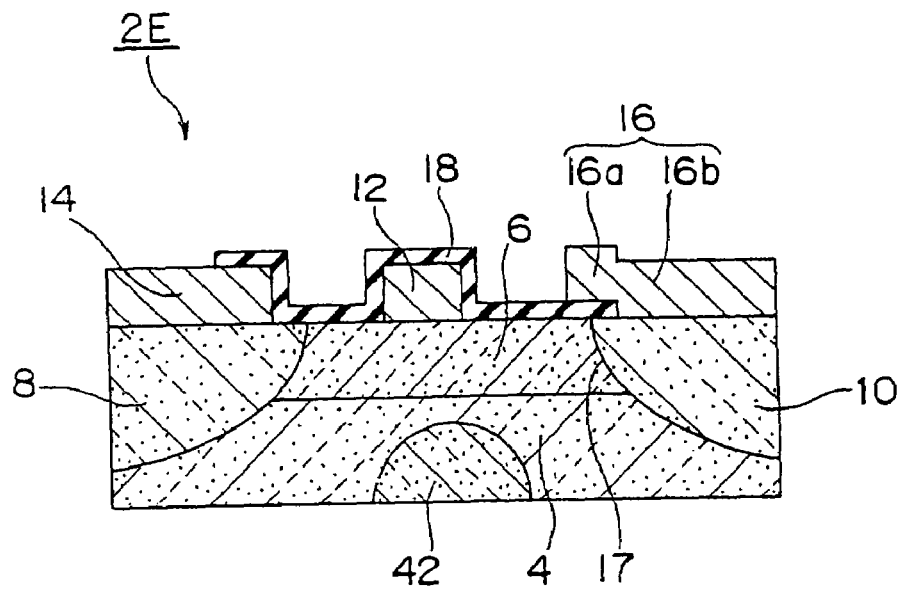
FIG. 9 is a sectional view of a variant of the fourth embodiment of the FET according to the present invention.

The conductive layer needs not to be in contact with the source region 8 as long as it is electrically connected with the source electrode 14 (and therefore its electric potential is 0V) in operation. Thus, a conductive layer 42 may be provided only at or proximate a point directly below the gate electrode edge 12a at a lower portion of the semiconductor substrate, as in a MESFET 2E shown in FIG. 9. However, the conductive layer is preferably in contact with the source region as described above, since the conductive layer at the bottom portion and the source electrode 14 heed not to be grounded separately.

The effect of reducing the electric field concentration at the gate electrode edge is also achieved by a construction in which the conductive layer is provided at or proximate the gate electrode edge at a lower portion of the semiconductor substrate and has an electric potential identical to that of the source electrode in operation even where the drain electrode has no part extended toward the gate electrode, which falls within the scope of the invention.

Fifth Embodiment

Figure 10:
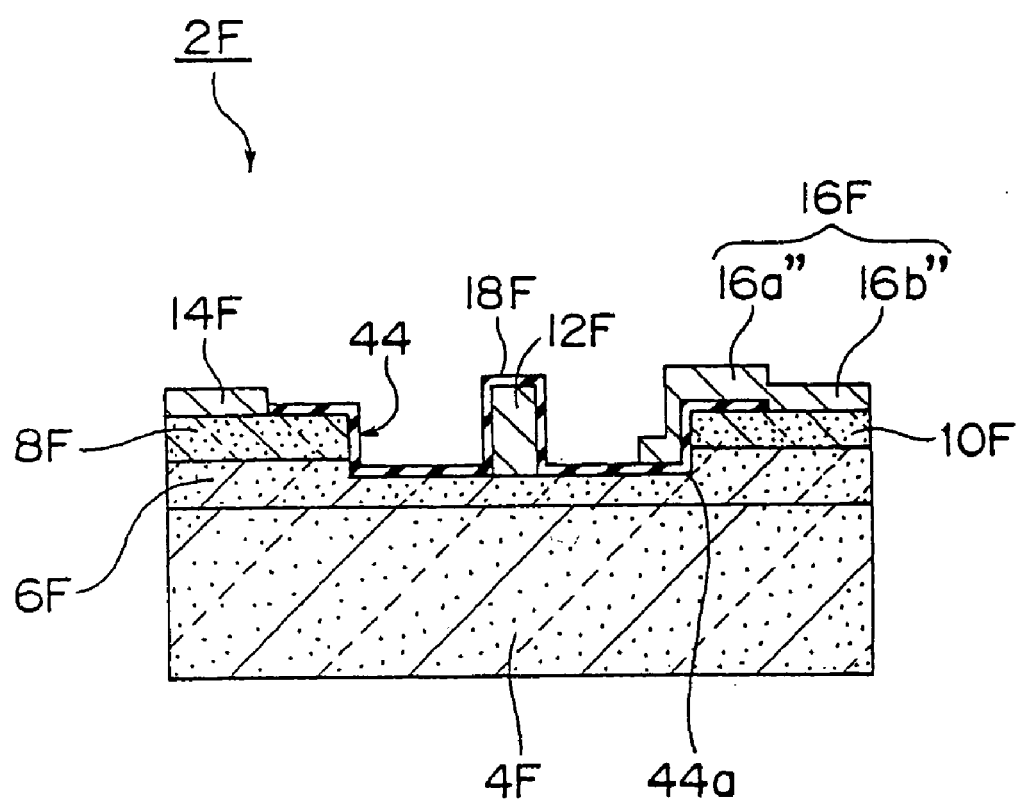
FIG. 10 is a sectional view of a fifth embodiment of the FET according to the present invention.

FIG. 10 shows a fifth embodiment of the field effect transistor or MESFET according to the present invention. In the MESFET 2F, a GaAs semi-insulating semiconductor substrate 4F has an n active layer 6F at an upper portion thereof. The substrate 4 also has a source region 8F and a drain region 10F on the n active layer 6F. Part of the n active layer. 6F and the n$^+$ active layers 8F, 10F is etched to form a recess 44. The recess 44 is located between the source and the drain regions 8F, 10F. A gate electrode 12F is provided generally on a center of the recess 44 so that a Schottky junction is formed between the gate electrode and the active layer 6F. A source electrode 14F is formed on the source region 8F so that an ohmic contact is formed therebetween. A drain electrode 16F is formed on the drain region 10F so that an ohmic contact is formed therebetween. The drain electrode 16F has a base part 16b" in contact with the drain region 10F and an extended part 16a" having one edge closer to the gate electrode 12F than a corner 44a of the recess 44. An insulation film 18F is provided between the extended part 16a" and the drain region 10F and between the extended part and the active layer 6F. As shown, the insulation film 18F is designed as passivation film to cover the surface of the MESFET 2F.

In operation of the MESFET 2F in the embodiment, an electric field is easily concentrated at the corner 44a of the recess 44. The field, however, interferes with an electric field generated in a MIS structure around the corner 44a which consists of the extended part 16a" of the drain electrode 16F, the insulation film 18F and the active layer 6F, thereby reducing the electric field concentration at the corner. Such effect is achieved in the embodiment by providing the insulation film 18F between the extended part 16a" and the recess 44a to prevent the extended part 16a" and the active layer 6F from being in contact with each other. Therefore, a construction in which an insulation film, which is an element of the MIS structure, does not function as passivation film of the MESFET 2F falls within the scope of the present invention.

There have been described in detail preferred embodiments of the field effect transistor according to the present invention, but it is to be understood that various modifications can be effected within the spirit and scope of the invention.

For example, although a description is provided with regard to the n-channel FET, the present invention can be applied to a p-channel FET. Also, a semi-insulating compound semiconductor substrate other than GaAs may be used.

What is claimed is:

1. A field effect transistor comprising:
   a semiconductor substrate;
   an active region located in an upper portion of the semiconductor substrate;
   source and drain regions located in the upper portion of the semiconductor substrate so that the active region is located between the source and drain regions;
   a gate electrode located on the active region;
   a source electrode located on the source region and forming an ohmic contact with the source region;
   a drain electrode having a base part located on and in ohmic contact with the drain region and an extended part extending toward the gate electrode, over and beyond a boundary between the active region and the drain region; a Schottky junction between the gate electrode and the active region; and
   an insulating film located between the boundary and the extended part and having a thickness that increases with position along a direction extending from the drain electrode to the gate electrode.

2. The field effect transistor in accordance with claim 1, wherein the thickness of the insulating film increases continuously with position along the direction.

3. The field effect transistor in accordance with claim 1, wherein the thickness of the insulating film increases stepwise with position along the direction.

4. The field effect transistor in accordance with claim 1, wherein the insulating film is located between and in contact with the semiconductor substrate and the extended part of the drain electrode.

* * * * *